(12) United States Patent
First et al.

(10) Patent No.: US 10,239,012 B2
(45) Date of Patent: Mar. 26, 2019

(54) METHODS OF SEPARATING MOLECULES

(71) Applicant: THE TRUSTEES OF PRINCETON UNIVERSITY, Princeton, NJ (US)

(72) Inventors: Eric L. First, Princeton, NJ (US); M. M. Faruque Hasan, Princeton, NJ (US); Christodoulos A. Floudas, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 468 days.

(21) Appl. No.: 14/766,388

(22) PCT Filed: Feb. 5, 2014

(86) PCT No.: PCT/US2014/014915
§ 371 (c)(1),
(2) Date: Aug. 6, 2015

(87) PCT Pub. No.: WO2014/124035
PCT Pub. Date: Aug. 14, 2014

(65) Prior Publication Data
US 2015/0360166 A1    Dec. 17, 2015

Related U.S. Application Data

(60) Provisional application No. 61/761,436, filed on Feb. 6, 2013, provisional application No. 61/765,284, filed
(Continued)

(51) Int. Cl.
*B01D 53/02* (2006.01)
*B01D 53/04* (2006.01)
(Continued)

(52) U.S. Cl.
CPC ........... *B01D 53/04* (2013.01); *B01D 53/047* (2013.01); *B01D 53/26* (2013.01); *G06F 17/50* (2013.01);
(Continued)

(58) Field of Classification Search
CPC .... A61K 31/00; A61K 31/41; A61K 31/4178; A61K 31/4184; B01D 2253/108;
(Continued)

(56) References Cited

U.S. PATENT DOCUMENTS 6,176,897 B1    1/2001   Keefer et al.
7,404,846 B2    7/2008   Golden et al.
(Continued)

OTHER PUBLICATIONS

Notification Concerning Transmittal of International Preliminary Report on Patentability and Written Opinion of the International Searching Authority, dated Aug. 20, 2015, 8 pages.
(Continued)

*Primary Examiner* — Christopher P Jones
(74) *Attorney, Agent, or Firm* — J. Clinton Wimbish; Nexsen Pruet, PLLC

(57) ABSTRACT

Disclosed herein are new methods, machines, processes, and systems for separating molecules by determining better materials and process optimization conditions. As a result of these advances, this disclosure provides improved carbon dioxide capture, better flue gas treatments, and more efficient methods of purifying gases have been developed. Optimal sorbents can be obtained by using a computational screening method that selects microporous structures (e.g. zeolites and metal-organic frameworks) from a database of materials with the greatest potential for cost-effective separations. The disclosed methods are the first to consider both the size and shape of the adsorbent material. This is also the
(Continued)

first disclosure to consider the process application and cost when selecting which material to use.

14 Claims, 7 Drawing Sheets

Related U.S. Application Data on Feb. 15, 2013, provisional application No. 61/873,940, filed on Sep. 5, 2013, provisional application No. 61/889,296, filed on Oct. 10, 2013, provisional application No. 61/926,561, filed on Jan. 13, 2014.

(51) Int. Cl.
*B01D 53/047* (2006.01)
*B01D 53/26* (2006.01)
*G06F 17/50* (2006.01)

(52) U.S. Cl.
CPC .. *B01D 2253/108* (2013.01); *B01D 2253/116* (2013.01); *B01D 2253/204* (2013.01); *B01D 2256/245* (2013.01); *B01D 2257/102* (2013.01); *B01D 2257/504* (2013.01); *B01D 2257/7025* (2013.01); *B01D 2257/80* (2013.01); *Y02C 10/08* (2013.01); *Y02C 20/20* (2013.01)

(58) Field of Classification Search
CPC ........ B01D 2253/116; B01D 2253/204; B01D 2256/245; B01D 2257/102; B01D 2257/504; B01D 2257/7025; B01D 2257/80; B01D 53/04; B01D 53/047; B01D 53/26; G06F 17/50; Y02C 10/08; Y02C 20/20
See application file for complete search history.

(56) References Cited

U.S. PATENT DOCUMENTS

| | | |
|---|---|---|
| 2001/0020416 A1 | 9/2001 | Yoshikawa et al. |
| 2007/0202038 A1* | 8/2007 | Yaghi .................... B01J 20/226 423/702 |
| 2010/0228069 A1 | 9/2010 | Kuznicki et al. |
| 2011/0100209 A1* | 5/2011 | Henderson ......... B01D 53/0462 95/11 |

OTHER PUBLICATIONS

International Search Report for corresponding PCT Application No. PCT/US2014/014915, dated Jun. 2, 2014, 2 pages.

Li, Gang et al., Surface Modification of 13X Zeolite Beads for Co2 Capture from Humid Flue-Gas Streams, Cooperative Research Centre for Greenhouse Gas Technologies, Department of Chemical Engineering, Monash University, Wellington Road, Clayton, Victoria 3800 Australia, 2 pages.

\* cited by examiner

METHODS OF SEPARATING MOLECULES

CROSS-REFERENCE TO RELATED APPLICATIONS

This application is a U.S. National Phase application of PCT/US2014/014915, filed Feb. 5, 2014, which claims priority to U.S. Provisional Patent Application Nos. 61/761,436, filed Feb. 6, 2013, 61/765,284, filed Feb. 15, 2013, 61/873,940, filed Sep. 5, 2013, 61/889,296, filed Oct. 10, 2013, and 61/926,561, filed Jan. 13, 2014, each of which are incorporated by reference in their entireties.

STATEMENT REGARDING UNITED STATES GOVERNMENT FUNDING

This invention was made with government support under Grant No. A0000994101 awarded by the University of Minnesota (University of Minnesota Prime from the National Science Foundation Prime Award No. EFRI-0937706); Grant No. CBET-1263165 awarded by the National Science Foundation; and Government support under FA9550-11-G-0028 awarded by the DoD, Air Force Office of Scientific Research, National Defense Science and Engineering Graduate (NDSEG) Fellowship, 32 CFR 10 168a. The Government has certain rights in the invention.

BACKGROUND

Figure 1:
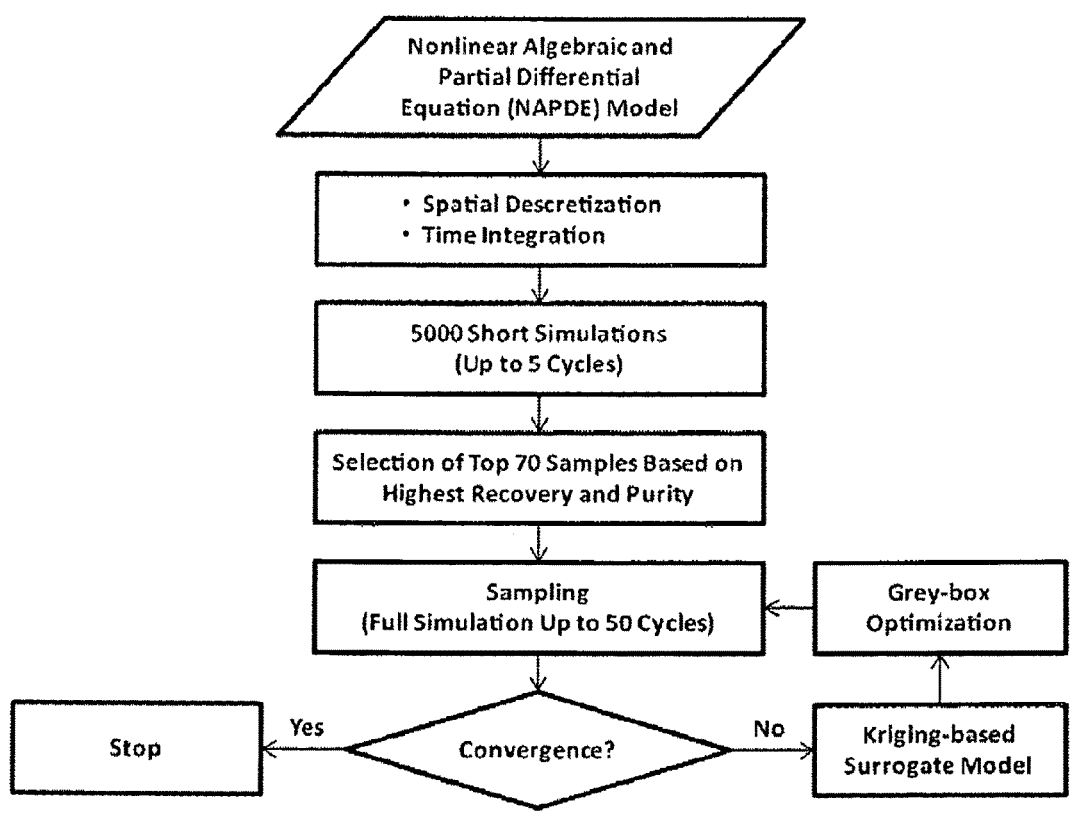
FIG. 1 shows a flow chart for an exemplary method of separating gases by optimizing a mathematical model of a separation process.

Carbon capture, utilization and storage (or carbon capture, utilization and sequestration, "CCUS"), is the process of capturing carbon dioxide ($CO_2$) from large point sources, such as fossil fuel power plants, transporting it to a storage and/or utilization site, and depositing/utilizing it where it will not enter the atmosphere. CCUS often involves the storage of the captured $CO_2$ in an underground geological formation such as saline formations, unmineable coalbeds, oil and gas reservoirs, etc. It also includes the utilization of the captured $CO_2$, for example as a pumping fluid for enhanced oil and/or gas recovery from oil and gas reservoirs, as a raw material for producing chemicals and fuels, and for methane recovery from coalbeds. CCUS that does not involve $CO_2$ utilization is often referred to as carbon capture and storage (or carbon capture and sequestration, "CCS").

Carbon capture is intended to prevent the release of large quantities of $CO_2$ into the atmosphere (from fossil fuel use in power generation and other industries). It is a potential means of mitigating the contribution of fossil fuel emissions to global warming and ocean acidification.

Although $CO_2$ has been injected into geological formations for several decades for various purposes, including enhanced oil recovery, the long term storage of $CO_2$ is a relatively new concept. Today, there exists a growing need for developing new methods of capturing, storing, and transporting captured carbon dioxide.

CCUS applied to a modern conventional power plant could reduce $CO_2$ emissions to the atmosphere by approximately 80-90% compared to a plant without CCUS. The IPCC estimates that the economic potential of CCUS could be between 10% and 55% of the total carbon mitigation effort until year 2100.

Capturing $CO_2$ is probably most effective at point sources, such as large fossil fuel or biomass energy facilities, industries with major $CO_2$ emissions, natural gas processing, synthetic fuel plants, cement plants, iron and steel plants, ethanol plants, and fossil fuel-based hydrogen production plants. Extraction (recovery) from air is possible, but not very practical. The $CO_2$ concentration drops rapidly moving away from the point source. The lower concentration increases the amount of mass flow that must be processed (per ton of carbon dioxide extracted).

Concentrated $CO_2$ from the combustion of coal (e.g., at power plants) in oxygen is relatively pure, and could be directly processed. Impurities in $CO_2$ streams could have a significant effect on their phase behavior and could pose a significant threat of increased corrosion of pipeline and well materials. In instances where $CO_2$ impurities exist and especially with air capture, a scrubbing process would be needed.

In post-combustion capture, the $CO_2$ is removed after combustion of the fossil fuel; Carbon dioxide is captured from flue gases at power stations or other large point sources. Post-combustion capture refers to the removal of $CO_2$ from power station flue gas prior to its compression, transportation and storage in suitable geological formations, as part of carbon capture and storage.

A number of different techniques are applicable, almost all of which are adaptations of acid gas removal processes used in the chemical and petrochemical industries. Many of these techniques existed before World War II and, consequently, post combustion capture is the most developed of the various carbon-capture methodologies.

The acid gas removal process (aka, mine gas treating or gas sweetening) refers to a group of processes that use aqueous solutions of various alkylamines (commonly referred to simply as amines) to remove hydrogen sulfide ($H_2S$) and carbon dioxide ($CO_2$) from gases. It is a common unit process used in refineries, and is also used in petrochemical plants, natural gas processing plants and other industries.

Today, the field of carbon capture needs better molecular separation processes. In particular, the field would benefits from new methods of capturing carbon dioxide that do not require the traditional acid gas removal process.

There also exists a need for limiting methane losses and purifying methane that is contaminated with carbon dioxide. The ongoing need for purifying methane is especially important in circumstances having a wide range of feed compositions, such as feeds with multiple $CO_2$ compositions ranging from $CO_2$-lean to $CO_2$-rich methane sources.

In pursuit of better carbon dioxide capture and methane purification, the art would benefit from developing better adsorbents (e.g., zeolites and MOFs) for pressure swing adsorption (PSA) and vacuum swing adsorption (VSA)

processes. Similarly, carbon capture and methane purification technology has an ongoing need for better PSA and VSA methods, which offer more cost efficient ways of separating carbon dioxide from molecular mixtures comprising carbon dioxide.

Improvements in PSA and VSA methods would have far reaching benefits, including Natural gas purification, bio-syngas purification, bio-fuel purification, xylenes purification, hydrogen purification, propane/propylene separation, ethane/ethylene separation, and other gaseous separations of molecules.

DETAILED DESCRIPTION

Advances in molecular separation have now been made. Disclosed herein are new methods for separating molecules by determining better materials and process optimization conditions. Thanks to the disclosed advances, better carbon dioxide capture and better flue gas treatments have been developed.

Advances in identifying sorbents for molecular separations have now been made. For example, better sorbents can be obtained by using a computational screening method that selects microporous structures (e.g. zeolites and metal-organic frameworks) from a database of materials with the greatest potential for cost-effective separations. The disclosed methods are the first to consider both the size and shape of the adsorbent material. This is also the first disclosure to consider the process application, process design, and process optimization when selecting which material to use.

Screening microporous structures by both pore size and shape has proven useful for identifying new microporous materials for separating molecules. The disclosed method considers both the material as well as the process, so it indicates both the feasibility and performance of a material and the optimal process parameters for performing the separation. The disclosed methods consider several metrics, including process cost, when selecting the best materials from large databases of possibilities through an efficient screening procedure.

The disclosed pore characterization methods for zeolites and metal-organic frameworks provide better information about the geometry and topology of the porous networks, including a three-dimensional visualization and quantitative data including portals, channels, cages, connectivity, pore size distribution, accessible volume, accessible surface area, largest cavity diameter, and pore limiting diameter. (First, E. L., Gounaris, C. E., Wei, J., and Floudas, C. A. Phys. Chem. Chem. Phys., 13:17339-17358, 2011; First, E. L., Floudas, C. A. Micropor. Mesopor. Mater., 165:32-39, 2013).

The shape-selective screening approach has applications for both separations as well as catalysis applications, where the selectivity data can be extended to reactants, products, and transition state structures. The disclosed methods are demonstrated for carbon capture, but the methodology is applicable to any separation application, and can be combined with other process models beyond pressure-swing adsorption (PSA) and vacuum-swing adsorption (VSA).

The above methods provide the first holistic approach to identifying the optimal sorbents for separation applications. Such methods effectively combine material selection with process optimization to generate a short list of candidate sorbents from a large database of microporous materials.

The disclosed methods build on existing methods for evaluating microporous materials for separation applications (adsorption selectivity, Henry constant, working capacity, total equilibrium capacity, and minimum parasitic energy), while also introducing new metrics that are demonstrated to select good candidates for cost-effective materials. One such metric is shape selectivity, which is a measure of the degree to which the zeolite can separate one molecule from another (or multiple others) based on shape and size exclusion, i.e., "shape selectivity" and "size selectivity".

Shape selectivity considers the hindrance to molecular transport through the most dominant pathway of a microporous structure. Shape selectivity emphasizes finding a material capable of high throughput, where diffusion through the main pores is much faster for one molecule compared to another, and may be particularly appropriate for membrane or diffusion-limited applications. (Gounaris, C. E., Floudas, C. A., and Wei, J. Chem. Eng. Sci., 61:7933-7948, 2006; Gounaris, C. E., Wei, J., and Floudas, C. A. Chem. Eng. Sci., 61:7949-7962, 2006; Gounaris, C. E., Wei, J., Floudas, C. A., AIChE J., 56:611-632, 2009; First, E. L., Gounaris, C. E., and Floudas, C. A. Langmuir, 29:5599-5608, 2013).

The disclosed methods are the first to utilize the metric of size selectivity, which takes into account the entire distribution of pore sizes. Size selectivity is a measure of relative difference in accessible pore volume between two molecules. In adsorption processes, side channels can play a key role, as molecules may fill into smaller pores of a structure, making size selectivity particularly appropriate. (Hasan, M. M. F., First, E. L., and Floudas, C. A. Phys. Chem. Chem. Phys., 15:17601-17618, 2013).

The methods of this disclosure apply the new metric of pore selectivity, which combines the shape-based energetic calculations of shape selectivity with pore accessibility calculations of size selectivity. It is a measure of the energetically-weighted accessibility of the pore system for one molecule compared to the other. (First, E. L., Hasan, M. M. F., and Floudas, C. A. Unpublished manuscript)

One advantage of the disclosed methods is that they combine material selection with process optimization by calculating the cost of the optimal process utilizing each material. This is achieved via a detailed nonlinear algebraic and partial differential equation (NAPDE)-based non-isothermal adsorption model that describes the overall separation process. (Hasan, M. M. F., Baliban, R. C., Elia, J. A., and Floudas, C. A. Ind. Eng. Chem. Res., 51:15665-15682, 2012; Hasan, M. M. F., First, E. L., and Floudas, C. A. Phys. Chem. Chem. Phys., 15:17601-17618, 2013). The disclosed methods optimize the separation process based on major independent variables, which may include but are not limited to column length, adsorption pressure, blowdown pressure, desorption/evacuation pressure, and the step durations for adsorption, blowdown, and desorption/evacuation, to minimize the total annualized cost subject to purity and recovery constraints.

The methods of this disclosure leverage an efficient Kriging-based grey-box optimization formulation. (Hasan, M. M. F., Baliban, R. C., Elia, J. A., and Floudas, C. A. Ind. Eng. Chem. Res., 51:15665-15682, 2012; Hasan, M. M. F., First, E. L., and Floudas, C. A. Phys. Chem. Chem. Phys., 15:17601-17618, 2013). The result is that we not only select cost-effective materials for a separation application, but also simultaneously provide the optimal process conditions.

One advantage of the above method is identifying new, better materials for separating molecules. This disclosure provides new sorbents. This disclosure provides new zeolites and metal-organic framework (MOF) sorbents. This disclosure provides new methods for using these sorbents in molecular separations. This disclosure provides new methods of treating flue gases, including a new dehydration method. This disclosure provides new methods for purifying methane.

In one embodiment, the disclosed methods are used for post-combustion carbon capture from power plant flue gases (separation of CO2 from primarily N2). Disclosed are 13 zeolite framework types with a process cost for carbon capture and compression up to 150 bar that is lower than the process cost using zeolite 13X, the most popular and commercially available zeolite for this application. These framework types are: AHT, NAB, MVY, ABW, AWO, WEI, VNI, TON, OFF, ITW, LTF, ERI, and MOZ. These new sorbent materials provide better, more cost effective carbon capture benefits than the state of the art zeolites.

We have also identified a number of novel sorbents for methane purification (separation of CO2 from primarily CH4). For example, we have identified 10 zeolite framework types that are both feasible (meaning that the purity of the methane product is at least 97% and at least 95% of the methane is recovered) and cost-effective for some feed conditions. Eight of these zeolites are feasible for all feed conditions in the range of 5%-50% CO2 content. The process cost for these zeolites includes the recovery and compression of methane, and the capture and compression of CO2.

This disclosure provides the following 10 new zeolite framework types for separating carbon dioxide from methane: WEI, AHT, AEN, ABW, APC, BIK, JBW, LTJ, MON, and NSI. The materials consistently in the top 5 for each feed condition are WEI, AHT, and AEN.

In one embodiment, this disclosure provides cost-effective materials for adsorption-based separation of carbon dioxide (CO2) from nitrogen (N2). The processes and compositions are useful for capturing CO2 from flue gas. The applications include (but are not limited to) separating CO2 from the following sources: coal-fired power plants, natural gas-fired power plants, oil-fired power plants, power plants that burn any carbonaceous fuels, agricultural processing plants, ammonia plants, asphalt plants, cement plants, refineries, natural gas processing plants, ethanol plants, petrochemical plants, iron and steel plants, paper and wood plants, sugar plants, and utility plants.

In one embodiment, this disclosure provides cost-effective materials for adsorption-based separation of carbon dioxide (CO2) from methane (CH4). The processes and compositions are useful for purifying methane. Methane purification includes (but is not limited to) purifying the following: natural gas, shale gas, coalbed methane, enhanced oil recovery (EOR) gas, biogas, and landfill gas.

The improved adsorbent materials were identified using a novel computational framework that combines material screening and process optimization. This in silico framework selects the most cost-effective materials for a separation application from a diverse range of feed conditions, including composition, pressure, temperature, and flow rate. The selected materials minimize investment and operating costs while satisfying stringent purity and recovery constraints.

In one embodiment, the disclosed methods include the following: geometric-level pore topology characterization via pore characterization; unique metrics including shape, size, and pore selectivities; atomistic-level molecular simulations on only a subset of the original databases; and adsorption selectivity as a screening stage rather than the final ranking.

In one embodiment, the process optimization portion of the disclosed methods has advantages including the following: feed dehydration to remove water, either pressure swing or vacuum swing adsorption modes to achieve the optimal adsorption; CO2 capture coupled with compression for sequestration; independently operating multiple and identical adsorption columns; blowdown to an intermediate pressure to increase CO2 purity.

In one embodiment, the process optimization portion of the disclosed methods has advantages including the following: either compression or expansion of the feed to achieve the optimal adsorption; CO2 capture coupled with compression for sequestration; independently operating multiple and identical adsorption columns; and product compression and power integration between the feed expander and the product compressor to minimize energy consumption.

The disclosed methods provide the first disclosure of using the above identified zeolites for carbon capture from flue gas (separation of CO2 from N2) or methane purification (separation of CO2 from methane). These zeolites perform these separations with minimal cost.

In one embodiment, the disclosed methods include a new material screening metric ("pore selectivity") to accommodate molecules with a non-circular footprint.

In one embodiment, the disclosed methods include screening criteria for filtering materials from a zeolite database.

In one embodiment, the disclosed methods include different force field parameters for adsorption calculations.

In one embodiment, the disclosed methods include an improved isotherm fitting algorithm. (Hasan, M. M. F., First, E. L., and Floudas, C. A. Phys. Chem. Chem. Phys., 15:17601-17618, 2013).

In one embodiment, the disclosed methods include dehydration of the feed.

In one embodiment, the disclosed methods include process choice, allowing pressure swing or vacuum swing adsorption modes.

In one embodiment, the disclosed methods include process choice, allowing feed expansion or compression.

In one embodiment, the disclosed methods include expansion through an expansion turbine.

In one embodiment, the disclosed methods include selecting a pressure reducing means.

In one embodiment, the disclosed methods include a tool for determining the cost-effectiveness of using an expansion turbine.

In one embodiment, the disclosed methods include a blowdown step to an intermediate pressure to increase CO2 purity.

In one embodiment, the disclosed methods include process conditions including two products (both CO2 and methane are products) that are extracted from the adsorption column at different steps in the cycle.

In one embodiment, the disclosed methods include conditions wherein each product is compressed to a different pressure.

In one embodiment, the disclosed methods include maximum operating pressure in the range of 1-60 bar.

In one embodiment, the disclosed methods include a means for selecting cost-effective materials for carbon capture for a range of feed conditions, including CO2 levels from 5% to 50%.

In one embodiment, the disclosed methods include a means for selecting cost-effective materials for methane purification for a range of feed conditions, including CO2 levels from 5% to 50%.

Disclosed herein is a process for separating carbon dioxide from a mixture of molecules comprising:

treating a mixture of molecules with a sorbent at a pressure of between about 0.5 to 15 bars;

adsorbing carbon dioxide from the mixture of molecules; and reducing the pressure of the environment surrounding the carbon dioxide enriched sorbent.

As used herein, the term "sorbent" means a material capable of adsorbing molecules. For example, a sorbent may be a zeolite, metal-organic framework, silicalite, aluminosilicate, titanosilicate, germanosilicate, covalent-organic framework, carbon molecular sieve, activated carbon, or silica gel.

As used herein, the term "carbon dioxide" means gas whose main compound has the molecular formula $CO2$.

As used herein, the term "mixture of molecules" means a material system consisting of two or more types of molecules that are mixed. In one embodiment, the mixture of molecules is a mixture of gases, for example a mixture of gases comprising carbon dioxide and one or more other gases. In one embodiment, the mixture of gases is a mixture of carbon dioxide and methane.

As used herein, the term "mixture of gases" means a mixture of molecules composed primarily of gases, and may contain small amounts of entrained particulates. In one embodiment, the mixture of gases is comprised of carbon dioxide and one or more other gases. For example, the mixture of gases could be flue gas, which contains carbon dioxide, nitrogen, oxygen, water, and small amounts of other gases, including sulfur oxides, nitrous oxides, carbon monoxide, and others, and entrained solids, including ash, and other particulates.

In one embodiment, the process for separating carbon dioxide from a mixture of molecules comprises a material chosen from a zeolite having one of the following framework types: ABW, AEN, AHT, APC, AWO, BIK, ERI, IHW, ITW, JBW, LTF, LTJ, MON, MVY, NAB, NSI, OFF, TON, VNI, and WEI.

As used herein, the term "zeolite" means an open three-dimensional framework structure composed of tetrahedrally-coordinated atoms ("T-atoms") connected with oxygen atoms. Typically, the T-atoms include silicon and aluminum, but may also include phosphorus, titanium, beryllium, germanium, and other metals. The structure may include extra-framework cations, such as hydrogen, sodium, potassium, barium, calcium, magnesium, iron, gallium, germanium, and others. The zeolite may include defects, such as the result of dealumination and desilication processes. The zeolite may include adsorbed material, including water, gases, and organic materials, such as the result of chemical vapor deposition, chemical liquid deposition, coking, and adsorption processes. The zeolite may include mesopores. The zeolite may be present in a binder, such as to form a powder or pellet.

As used herein, the term "framework type" refers to a description of the network of T-atoms. Framework types are typically assigned three-letter codes by the International Zeolite Association (IZA), based on rules set up by the IUPAC Commission on Zeolite Nomenclature in 1978. The framework type of a zeolite is independent of the chemical formula of the crystal and any extra-framework cations, adsorbed materials, defects, or binders.

In one embodiment, the process for separating carbon dioxide from a mixture of molecules comprises adsorbing carbon dioxide at a pressure of between about 0.5-15 bars.

As used herein, the term "pressure" means the average pressure within the vessel in which the adsorption occurs. In one embodiment, the pressure is the average pressure within a column containing zeolite that is adsorbing carbon dioxide from a mixture of molecules. A pressure of between about 0.5-15 bars means a pressure maintained at a relatively steady value no less than 0.5 bars and no greater than 15 bars. A bar is a unit of pressure equal to 100 kilopascals, approximately 0.987 atmospheres.

In one embodiment, the process for separating carbon dioxide from a mixture of molecules comprises adsorbing at a pressure of between about 1-10 bars.

In one embodiment, the process for separating carbon dioxide from a mixture of molecules comprises a gaseous mixture comprising two or more gases chosen from carbon dioxide, nitrogen, water, oxygen, hydrogen, or hydrocarbon gases.

As used herein, the term "separating" means splitting a mixture of molecules into two or more distinct portions, each with a different composition. In one embodiment, separating is the process by which a mixture of molecules containing carbon dioxide is split into a mixture of molecules with a higher concentration of carbon dioxide and a mixture of molecules containing a reduced amount of carbon dioxide.

In one embodiment, the process for separating carbon dioxide from a mixture of molecules comprises reducing the pressure of the environment surrounding the carbon dioxide enriched zeolite to between 0.005-0.5 bars.

As used herein, the term "carbon dioxide enriched sorbent" means a sorbent with carbon dioxide adsorbed within the pores. In one embodiment, a carbon dioxide enriched sorbent comprises more carbon dioxide adsorbed within its pores than would occur spontaneously in air at standard temperature and pressure.

As used herein, the term "carbon dioxide enriched zeolite" means a carbon dioxide enriched sorbent where the sorbent is a zeolite.

In one embodiment, the process for separating carbon dioxide from a mixture of molecules comprises reducing the pressure of the environment surrounding the carbon dioxide enriched zeolite to between 0.01-0.1 bars.

As used herein, the term "reducing the pressure" means a process by which the pressure is lowered. In one embodiment, reducing the pressure is achieved through the use of a vacuum pump. In another embodiment, reducing the pressure is achieved through the use of a pressure relief valve.

As used herein, the term "separating carbon dioxide from a mixture of molecules" means separating a mixture of molecules, containing carbon dioxide and other gases, into a mixture of molecules with a higher concentration of carbon dioxide and a mixture of molecules containing a reduced amount of carbon dioxide. In one embodiment, the mixture of molecules with a higher concentration of carbon dioxide contains at least 90% carbon dioxide by volume.

In one embodiment, the process for separating carbon dioxide from a mixture of molecules comprises dehydrating the mixture.

As used herein, the term "dehydrating" means reducing the concentration of water. For example, the phrase "dehydrating the mixture" means reducing the concentration of water from a mixture of molecules.

In one embodiment, the process for separating carbon dioxide from a mixture of molecules comprises a material chosen from a zeolite having one of the following framework types: AHT, NAB, MVY, ABW, AWO, WEI, VNI, TON, OFF, ITW, LTF, ERI, and IHW.

In one embodiment, the process for separating carbon dioxide from a mixture of molecules comprises a material is chosen from a zeolite having one of the following framework types: WEI, AHT, AEN, ABW, APC, BIK, JBW, LTJ, MON, and NSI.

In one embodiment, the process for separating carbon dioxide from a mixture of molecules comprises a cycle time of between 40-500 seconds.

As used herein, the term "cycle time" means the time required to complete a full adsorption-desorption cycle using adsorption-based processes. For example, a cycle time of between 40-500 seconds would describe an adsorption-desorption cycle with a duration selected from the range 40-500 seconds.

In one embodiment of the process for separating carbon dioxide from a mixture of molecules comprises a cycle time of between 100-250 seconds.

In one embodiment of the process for separating carbon dioxide from a mixture of molecules comprises a pressure of between 1-250 bar.

Disclosed herein is a gas separation machine for capturing carbon dioxide comprising:
  a vessel;
  a zeolite having one of the following framework types: ABW, AEN, AHT, APC, AWO, BIK, ERI, IHW, ITW, JBW, LTF, LTJ, MON, MVY, NAB, NSI, OFF, TON, VNI, and WEI.

As used herein, the term "vessel" means a container enclosing material with one or more ports through which material can enter or exit. In one embodiment, the vessel is a column containing a sorbent and a mixture of gases enters, resides in, and exits the column. Examples of vessels falling within the scope of this disclosure would include adsorption columns, etc.

In one embodiment, the gas separation machine comprises a feed compressor.

As used herein, the term "feed" means a mixture of gases that is to be treated by a process.

As used herein, the term "feed compressor" means a device to increase the pressure of the feed.

In one embodiment, the gas separation machine comprises a product compressor.

As used herein, the term "product compressor" means a device to increase the pressure of carbon dioxide product.

As used herein, the term "carbon dioxide product" should be interpreted as meaning a mixture of gases with a higher concentration of carbon dioxide than in the feed. In one embodiment, carbon dioxide product is a mixture of gases with at least 90% carbon dioxide by volume.

In one embodiment, the gas separation machine comprises one or more vacuum pumps.

As used herein, the term "vacuum pump" means a device to decrease the pressure of a vessel.

In one embodiment, the gas separation machine comprises a carbon dioxide compression train.

As used herein, the term "carbon dioxide compression train" means a device with one or more compressors to increase the pressure of carbon dioxide.

In one embodiment the carbon dioxide compression train comprises an inter cooling means.

As used herein, the term "inter cooling means" should be interpreted as meaning one or more devices to reduce the temperature of carbon dioxide in between successive compressors.

In one embodiment, the disclosed gas separation machine comprises a liquid desiccant system.

As used herein, the term "liquid desiccant system" means a device for dehydrating by removing water through a liquid.

In one embodiment, the liquid desiccant system comprises triethylene glycol.

As used herein, the term "triethylene glycol" means the molecule, 2-[2-(2-Hydroxyethoxy)ethoxy]ethanol, which is defined by the molecular formula with molecular formula HOCH2CH2OCH2CH2OCH2CH2OH, or triethylene glycol solution.

EXAMPLES

The following examples are illustrative only, and are not intended to be limiting of the invention, as claimed.

Example 1—Process Optimization

Figure 3:
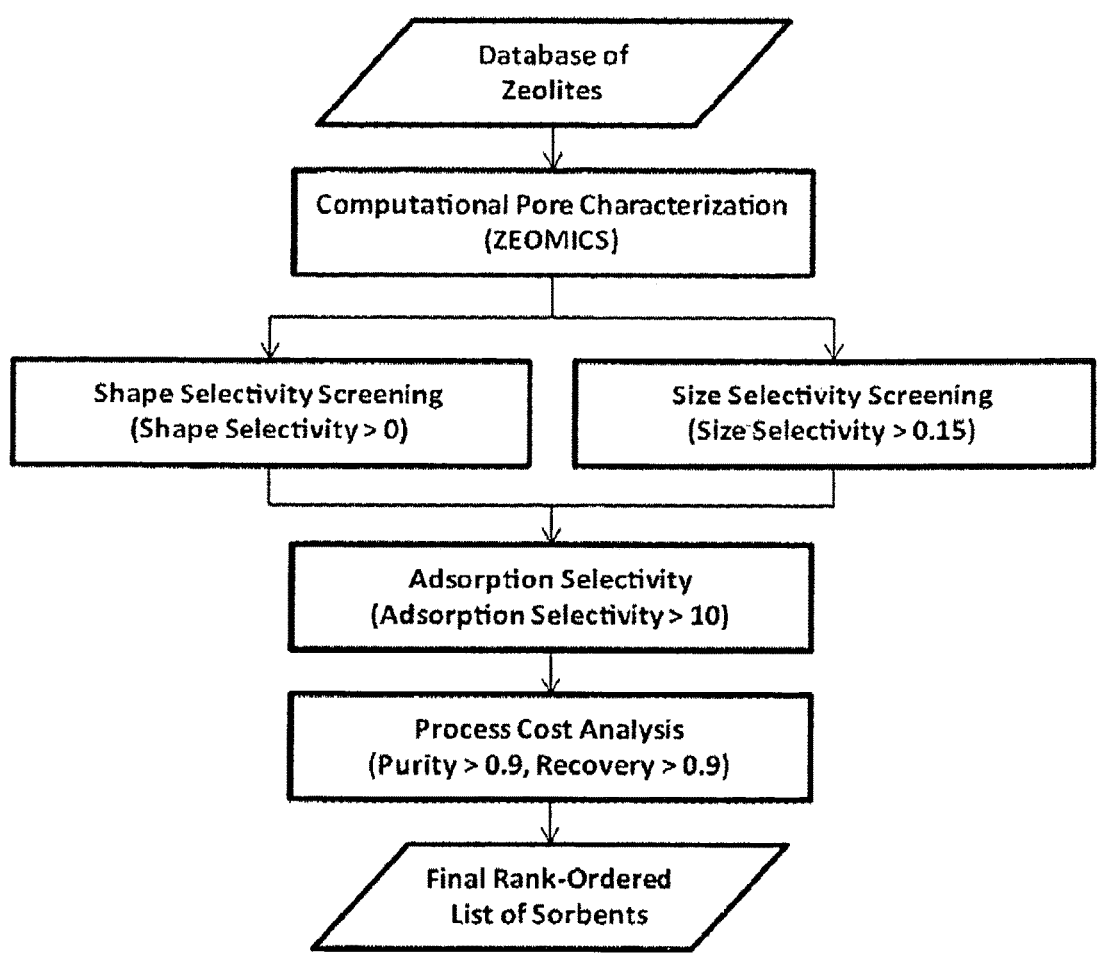
FIG. 3 shows a flow chart for an exemplary method of separating carbon dioxide gas from nitrogen gas.

Potential zeolites and metal-organic frameworks were identified based on their pore sizes using ZEOMICS and MOFomics, three-dimensional pore characterization methods. (First, E. L., Gounaris, C. E., Wei, J., and Floudas, C. A. Phys. Chem. Chem. Phys., 13:17339-17358, 2011; First, E. L., Floudas, C. A. Micropor. Mesopor. Mater., 165:32-39, 2013). The identified materials were ranked based on shape selectivity and size selectivity. The top structures were selected. Adsorption isotherms were generated for those top structures. The Henry constants were calculated for those top structures. Those top structures were further filtered based on adsorption selectivity. For each sorbent on the short list of remaining candidates, a PSA/VSA process was optimized (using the algorithm depicted in FIG. 1) to obtain the minimum process cost, and the corresponding purity, recovery and energy penalty, using a detailed mathematical model. (Hasan, M. M. F., Baliban, R. C., Elia, J. A., and Floudas, C. A. Ind. Eng. Chem. Res., 51:15665-15682, 2012; Hasan, M. M. F., First, E. L., and Floudas, C. A. Phys. Chem. Chem. Phys., 15:17601-17618, 2013). FIG. 3 shows a flow chart representation of the material selection and process optimization method.

Example 2—Carbon Capture from Power Plant Flue Gas

New, better zeolites for carbon capture from power plant flue gases were identified by using the disclosed methods and systems. A flow chart of the material screening and process optimization method is shown in FIG. 3. The accessible volume, accessible surface area, pore limiting diameter (PLD), and largest cavity diameter (LCD) data were calculated for each of 199 silica zeolite structures with pore characterizations from our database, ZEOMICS. (First, E. L., Gounaris, C. E., Wei, J., and Floudas, C. A. Phys. Chem. Chem. Phys., 13:17339-17358, 2011) Shape selectivity was calculated for CO2 versus N2 for each material. (Gounaris, C. E., Floudas, C. A., and Wei, J. Chem. Eng. Sci., 61:7933-7948, 2006; Gounaris, C. E., Wei, J., and Floudas, C. A. Chem. Eng. Sci., 61:7949-7962, 2006; Gounaris, C. E., Wei, J., Floudas, C. A., AIChE J., 56:611-632, 2009; First, E. L., Gounaris, C. E., and Floudas, C. A. Langmuir, 29:5599-5608, 2013). Size selectivity was calculated for CO2 versus N2 for each material. (Hasan, M. M. F., First, E. L., and Floudas, C. A. Phys. Chem. Chem. Phys., 15:17601-17618, 2013).

In a screening process, zeolites with shape selectivity greater than 0 or size selectivity greater than 0.15 were selected for further consideration. CO2 and N2 adsorption isotherms were generated for each of these structures at 25° C. to calculate adsorption selectivity. (Hasan, M. M. F., First, E. L., and Floudas, C. A. Phys. Chem. Chem. Phys., 15:17601-17618, 2013). Zeolites with adsorption selectivity less than 10 were filtered out. CO2 and N2 adsorption isotherms at four additional temperatures (50° C., 75° C., 100° C., and 125° C.) were calculated for the remaining structures, which were fit to a dual-site Langmuir model.

The equilibrium performance of the selected zeolites was evaluated by using a dual-site Langmuir model fitted with equilibrium isotherm data generated using grand canonical Monte Carlo (GCMC) simulations. (Hasan, M. M. F., First, E. L., and Floudas, C. A. Phys. Chem. Chem. Phys., 15:17601-17618, 2013).

To determine whether the transport into the solid phase is controlled by micropore or macropore diffusion, the mass transfer resistances in micropores and macropores were estimated and compared at linear equilibrium.

The calculated micropore and macropore resistances suggested that macropore resistance controls the rate of intra-particle mass transfer, which in the case of zeolite-based CO2 capture, also controls the inter-phase mass transfer. The mass transfer rate between the gas and solid phases was attained by using a linear driving force (LDF) model. (Hasan, M. M. F., Baliban, R. C., Elia, J. A., and Floudas, C. A. Ind. Eng. Chem. Res., 51:15665-15682, 2012; Hasan, M. M. F., First, E. L., and Floudas, C. A. Phys. Chem. Chem. Phys., 15:17601-17618, 2013).

Example 3—Capturing Carbon Dioxide from Flue Gas

To evaluate the performance of the top adsorption-selective zeolites in an adsorption process, the following were used: (a) PSA cycle model, (b) a process configuration model, and (c) a detailed adsorption/desorption model for the process.

Figure 6:
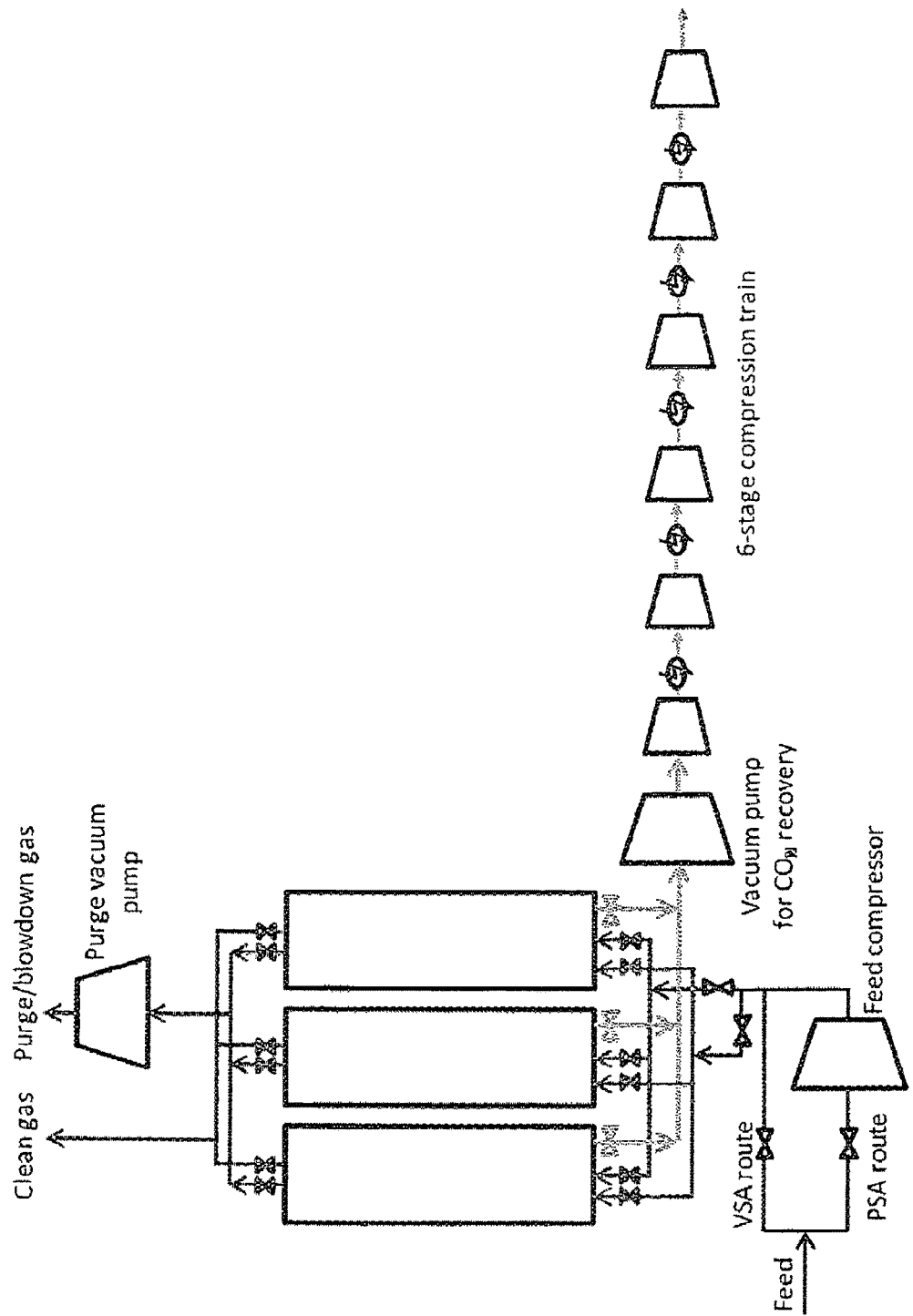
FIG. 6 shows an exemplary gas separation process, applied to capturing carbon dioxide from flue gas.
Figure 7:
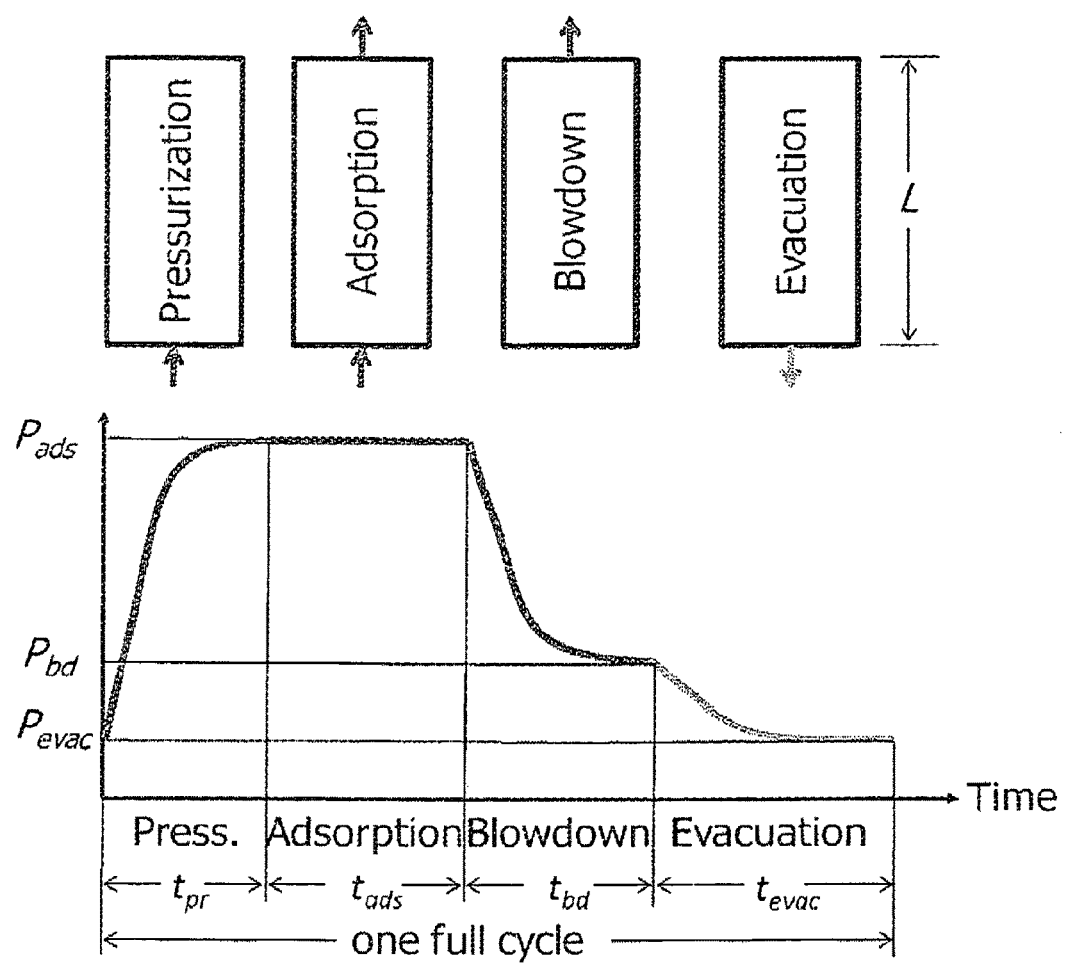
FIG. 7 shows an exemplary pressure swing adsorption process cycle configuration, applied to capturing carbon dioxide from flue gas.

FIG. 7 shows four steps in a cycle along with their usual pressure profiles. FIG. 6 shows a process diagram. Feed gas is used in step 1 for pressurizing the bed and in step 2 for CO2 adsorption at the adsorption pressure. In the forward blowdown step (step 3), adsorbed N2 is purged by reducing the column pressure to an intermediate pressure. In the last step, the adsorbed CO2 is desorbed by further reducing the column pressure. Starting from an initial bed condition, the process undergoes a transient state for a number of cycles before reaching a cyclic steady state, which is where the initial and final conditions for a cycle appear to be the same. In this example, when the process is started with sorbent saturated with N2, cyclic steady state is usually reached after about 50 cycles.

Example 4—Configuration of a CO2 Capture Process

As shown in FIG. 6, the above 4-step PSA cycle (shown in FIG. 7) can operate in either PSA or VSA mode. In PSA mode, feed gas enters through inlet a where a compressor compresses the gas to the adsorption pressure, while in VSA mode, an inlet is used to feed the gas at atmospheric pressure. The feed is considered to be a mixture of 14% CO2 and 86% N2 at 1 kmol/s. Multiple columns packed with adsorbent zeolites are used, and the total number of columns is calculated using the procedure outlined. (Hasan, M. M. F., Baliban, R. C., Elia, J. A., and Floudas, C. A. Ind. Eng. Chem. Res., 51:15665-15682, 2012; Hasan, M. M. F., First, E. L., and Floudas, C. A. Phys. Chem. Chem. Phys., 15:17601-17618, 2013).

Example 5—Separating Carbon Dioxide from Nitrogen

FIG. 7 shows a 4-step PSA cycle with corresponding pressure profiles. FIG. 6 shows a process diagram. Each column has three different outlets. One outlet is used to vent the non-adsorbed gas during the adsorption step; a second outlet is used to purge mostly N2 during the blowdown step; a third outlet is used to recover the product CO2 during the evacuation step. A vacuum pump is placed at an outlet to purge N2 out of the system. Similarly, a second vacuum pump is placed at an outlet to extract CO2 at the lowest pressure. Lastly, the extracted CO2 is compressed to send to the sequestration site using a 6-stage compressor system with interstage cooling.

A detailed nonlinear algebraic and partial differential equation (NAPDE)-based non-isothermal adsorption model was used to describe the overall PSA process. (Hasan, M. M. F., Baliban, R. C., Elia, J. A., and Floudas, C. A. Ind. Eng. Chem. Res., 51:15665-15682, 2012; Hasan, M. M. F., First, E. L., and Floudas, C. A. Phys. Chem. Chem. Phys., 15:17601-17618, 2013). The model was used to evaluate a multi-component adsorption system in an adsorbent-packed column with non-isothermal adsorption/desorption including frictional pressure drop. Temperature and pressure/velocity effects and heat transfer resistance across the column wall were also evaluated.

Example 6—Optimizing the PSA Process for Carbon Capture

The disclosed methods were used to minimize the total annualized cost of CO2 capture and compression using the 4-step PSA process to obtain CO2 at 150 bar for storage. In this example, the minimum purity and recovery were both set to be 90%. The NAPDE model included seven major independent variables, namely column length, adsorption pressure, blowdown pressure, evacuation pressure, and the durations for adsorption, blowdown, and evacuation.

The optimization method is depicted in FIG. 1. The following process steps were performed: (i) solving the original NAPDE model at several fixed conditions to generate input-output data (samples), (ii) developing a Kriging-based surrogate model using the samples, (iii) optimizing the surrogate model for subsequent samplings, and (iv) repeating steps (ii) and (iii) until convergence to an optimal solution. The PSA optimization was performed for each selected zeolite generating a rank-ordered list of cost-effective sorbents. Combinatorial optimization-based techniques were applied for the simultaneous selection of materials and processes for cost-effective separation.

Example 7—Separation of Carbon Dioxide from Methane

Figure 2:
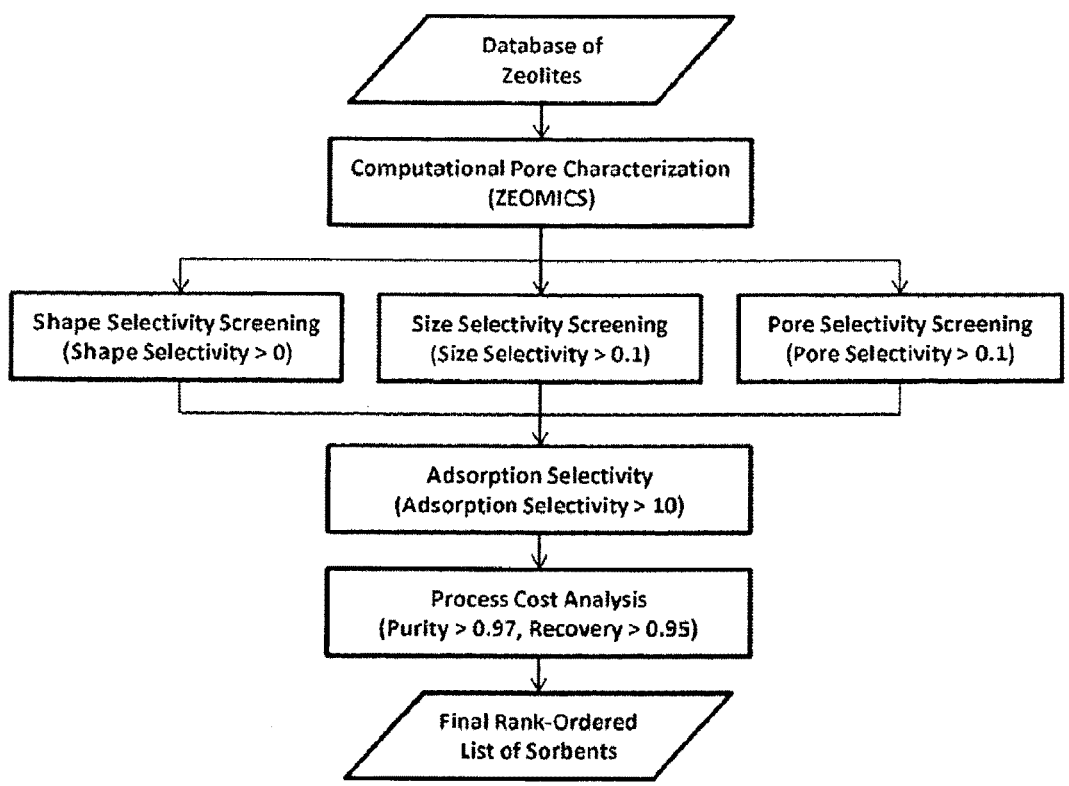
FIG. 2 shows a flow chart for an exemplary method of separating carbon dioxide gas from methane gas.

The material screening and process optimization method is shown in FIG. 2. Candidate zeolites were identified for separating CO2 from methane. Zeolites with shape selectivity greater than 0, size selectivity greater than 0.1, or pore selectivity greater than 0.1 were selected for further consideration. For zeolites meeting these requirements, CO2 and methane adsorption isotherms were generated at 25° C. to calculate adsorption selectivity. Zeolites with adsorption selectivity less than 10 were filtered out from further consideration. For the remaining structures, CO2 and methane adsorption isotherms were constructed at four additional temperatures (50° C., 75° C., 100° C., and 125° C.), which were fit to a dual-site Langmuir model.

A dual-site Langmuir model fitted with equilibrium isotherm data generated using grand canonical Monte Carlo (GCMC) simulation was used to evaluate the equilibrium performance of the selected zeolites. To determine whether the transport into the solid phase was controlled by micropore or macropore diffusion, the mass transfer resistances in micropores and macropores at linear equilibrium were evaluated.

Figure 4:
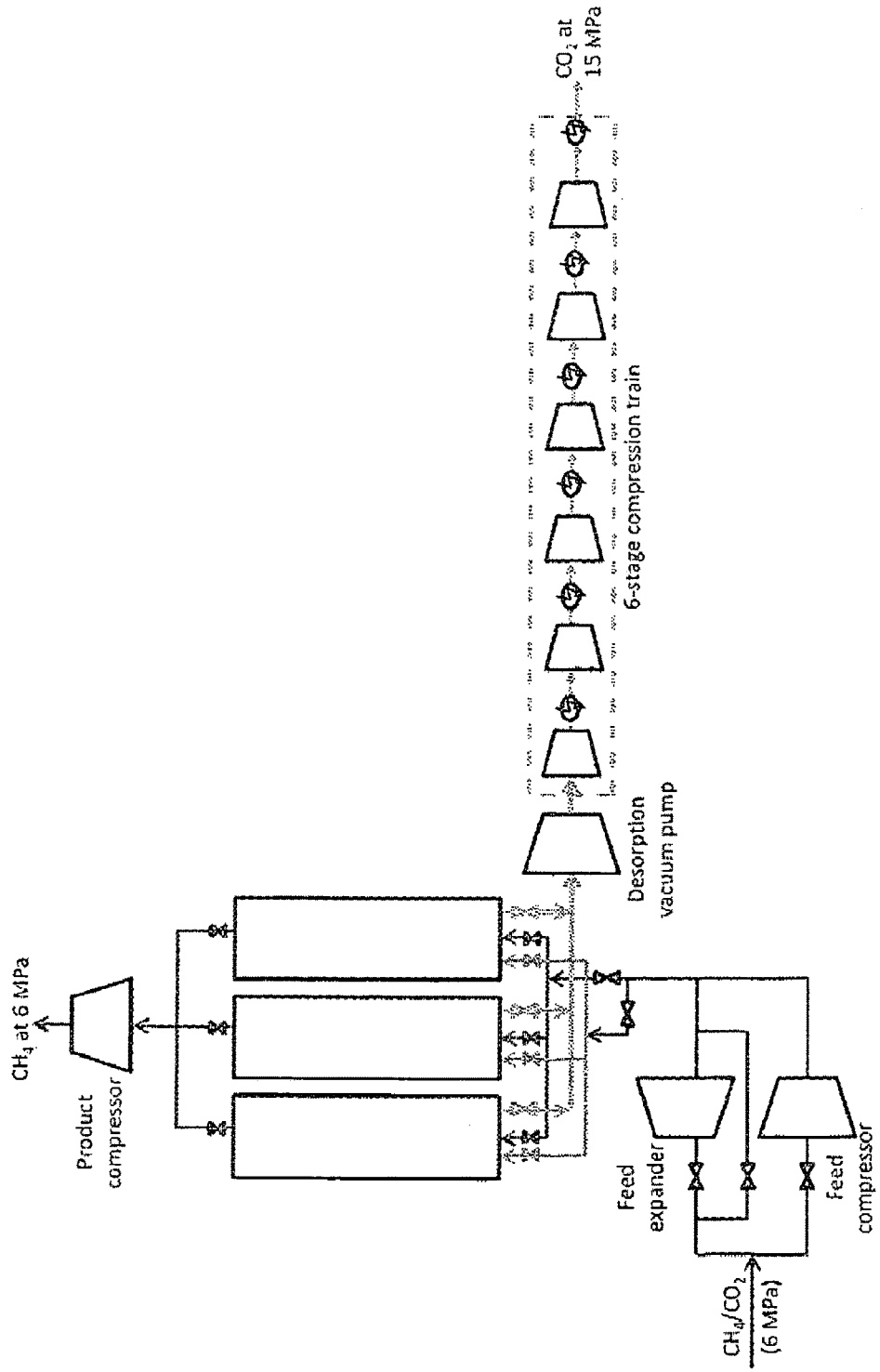
FIG. 4 shows an exemplary gas separation process, applied to methane purification.

The process diagram is depicted in FIG. 4. The feed can be expanded or compressed to reach the optimal adsorption pressure. One or multiple identical zeolite-packed adsorption columns were used for adsorption. Since CO2 is selectively adsorbed over methane in many zeolites, most of the methane fed into a column passed through without being adsorbed. The clean methane was then compressed to 60 bar to meet the specification for pipeline transportation.

A desorption (evacuation) vacuum pump was used for column regeneration. The desorption vacuum pump was placed at the feed-end of a column to purge most of the residual CO2 and methane at moderate or low vacuum. CO2 from the vacuum pump was compressed to 150 bar for sequestration by using a 6-stage compression train with intercoolers and a pressure ratio of 2.3 at each stage.

Figure 5:
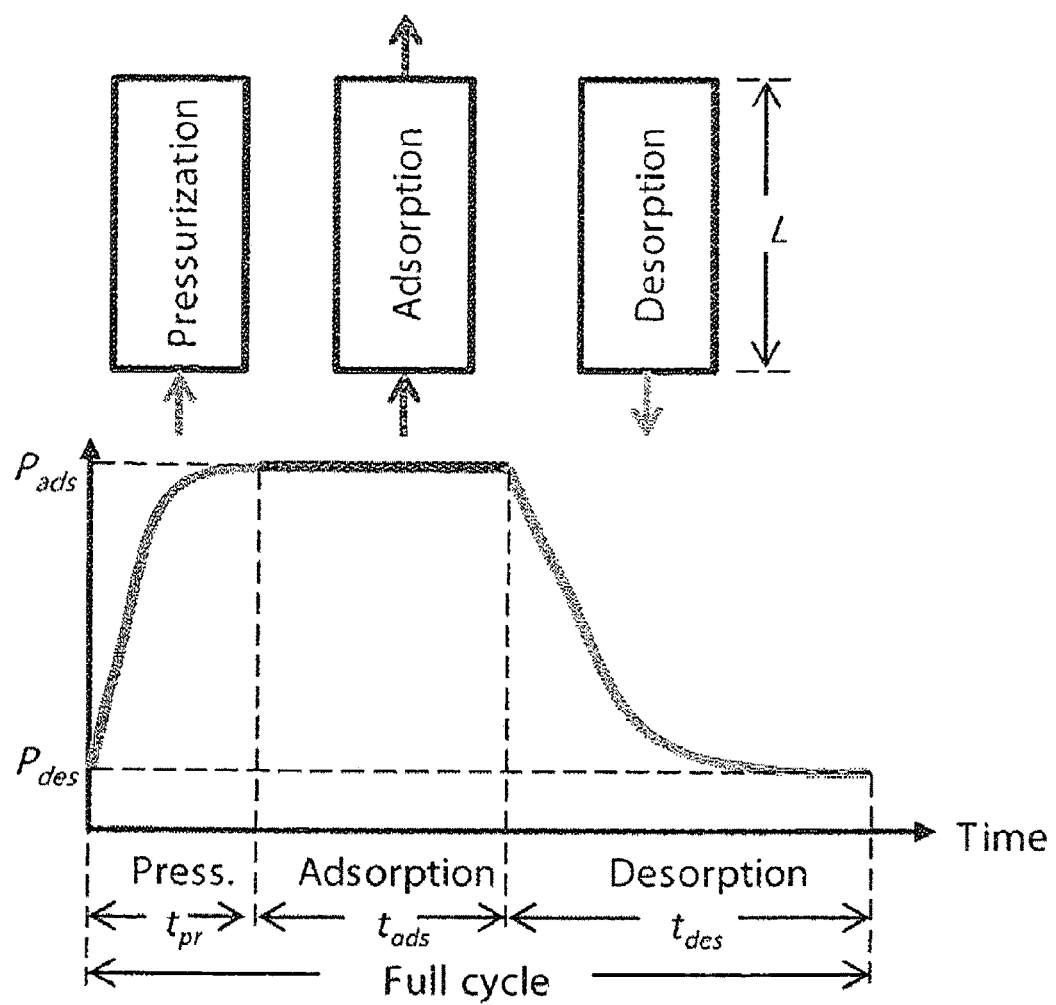
FIG. 5 shows an exemplary pressure swing adsorption process cycle configuration, applied to methane purification.

The PSA process was optimized to minimize the total annualized cost of 002/methane separation and compression using the 3-step PSA process (illustrated in FIG. 5) to obtain methane at 60 bar for transportation and CO2 at 150 bar for transportation for utilization or sequestration.

A NAPDE model using the following five independent variables was used: column length, adsorption pressure, desorption pressure, and the step durations for adsorption and desorption.

Example 8—Determining Conditions for Separating CO2 from a Flue Gas Comprising a Mixture of CO2 and N2

From a database of microporous materials, potential zeolites were identified based on their pore sizes using a three dimensional characterization method. These materials were ranked based on shape selectivity and size selectivity. Next, zeolites with highest rankings from both lists of shape-selective and size-selective materials were selected. Complete adsorption isotherms were calculated for CO2 and N2 by using the crystal structures of the selected materials. The Henry constants were calculated for these materials. The materials were additionally screened based on adsorption selectivity. Each selected zeolite was represented by its isotherm model. For the zeolites meeting the cut-off criteria for shape or size selectivity and adsorption selectivity, PSA/VSA process was optimized to obtain the minimum capture and compression cost and the corresponding purity, recovery and energy penalty using a detailed mathematical model. The minimum cost of capture and compression was used as the final metric to compare those zeolites that can capture CO2 with at least 90% purity and 90% recovery.

Example 9—Capturing CO2 from Coal-Fired Power Plant Flue Gas

In this example, the feed gas was composed of 15% H2O and 85% non-aqueous gases. Of the non-aqueous gases, 14% was CO2 and 86% was N2 and O2. The flow rate was 1 kmol/s.

Notably, the operating conditions remain the same for other flow rates, except that the number of columns or number of trains (identical process configurations operating in parallel) may change. In all cases, feed dehydration is independent of sorbent.

The following process conditions were used:

| Unit | Operating conditions | Description |
|---|---|---|
| Direct contact cooler | Temp.: 55 → 35° C. | Removes water from gas mixture (up to 5.5%) |
| TEG-absorber | Temp. 35° C., | Removes water from gas mixture (up to 0.1%) |
| Heater | Temp.: 73° C. | Heats water-rich solvent |
| Vacuum flash unit | P: 0.04 bar | Removes water from solvent using vacuum flash |
| Cooler | Temp.: 65° C. | Cools water-lean solvent |

All sorbents utilized a pressurization step time of 20 s. In each case, the pressurization step brought the column pressure from the evacuation step pressure to the adsorption step pressure. All sorbents used two adsorption columns. However, any number of columns could be used by applying the disclosed optimization methods.

| Zeolite | Column length (m) | Adsorption step pressure (bar) | Adsorption step duration (s) | Blowdown step pressure (bar) | Blowdown step duration (s) | Evacuation step pressure (bar) | Evacuation step duration (s) |
|---|---|---|---|---|---|---|---|
| AHT | 1 | 2.01 | 33.73 | 0.65 | 49.26 | 0.03 | 74.45 |
| NAB | 1.08 | 5.86 | 20.26 | 0.61 | 35.83 | 0.05 | 68.59 |
| MVY | 1.03 | 1.94 | 23.66 | 0.38 | 39.43 | 0.01 | 82.2 |
| ABW | 1 | 2.34 | 31.88 | 0.48 | 50.77 | 0.02 | 69.97 |
| AWO | 1 | 2.2 | 50 | 0.35 | 55.13 | 0.02 | 100 |
| WEI | 1.03 | 1.91 | 20.47 | 0.39 | 43.32 | 0.01 | 80.74 |
| VNI | 1 | 3.32 | 24.79 | 0.59 | 63.06 | 0.02 | 79.91 |
| TON | 1 | 2.92 | 20 | 0.39 | 72.43 | 0.03 | 92.8 |
| OFF | 1 | 2.91 | 30.16 | 0.36 | 72.2 | 0.03 | 100 |
| ITW | 1 | 2.8 | 30.22 | 0.32 | 72.66 | 0.03 | 98.63 |
| LTF | 1 | 2.82 | 29.76 | 0.47 | 82.75 | 0.02 | 100 |
| ERI | 1 | 3.08 | 27.25 | 0.45 | 66.54 | 0.02 | 87.79 |
| MOZ | 1 | 1.67 | 28.73 | 0.29 | 74.22 | 0.01 | 100 |

The CO2 compression process is independent of sorbent. The CO2 compression process is as follows:

| Unit | Operating conditions | Description |
|---|---|---|
| 6-stage CO$_2$ compression train | 6 stages with intercoolers, each having a pressure ratio of 2.33 | Compresses CO$_2$ up to 150 bar |

Example 10—Purification of Natural Gas

In this example, the feed was a mixture of CH4 and CO2 at 0.1 kmol/s.

The same operating conditions can be used for other flow rates, except that the number of columns or number of trains (identical process configurations operating in parallel) may change. Such changes could be recognized and applied by an ordinary artisan using the disclosed methods.

In this example, all sorbents and conditions have pressurization step time of 20 s. In this example, all sorbents and conditions use a column length of 1 m.

The following conditions were applied to purifying methane:

| Zeolite | Number of columns | Adsorption step pressure (bar) | Adsorption step duration (s) | Desorption step pressure (bar) | Desorption step duration (s) |
|---|---|---|---|---|---|
| Feed is 5% CO2, 95% CH4 | | | | | |
| ABW | 2 | 3 | 77.22 | 0.09 | 69.4 |
| AHT | 2 | 2.64 | 100 | 0.08 | 80 |
| APC | 2 | 3.74 | 87.67 | 0.1 | 80 |
| WEI | 2 | 3.42 | 61.24 | 0.1 | 52.93 |
| AEN | 2 | 2.63 | 83.28 | 0.07 | 80 |
| BIK | 2 | 2.52 | 100 | 0.07 | 80 |
| JBW | 2 | 2.75 | 100 | 0.08 | 80 |
| LTJ | 2 | 5 | 46.18 | 0.07 | 61.34 |
| MON | 2 | 3.26 | 100 | 0.09 | 80 |
| NSI | 2 | 4.24 | 70 | 0.01 | 80 |
| Feed is 10% CO2, 90% CH4 | | | | | |
| WEI | 2 | 5 | 54.78 | 0.1 | 68.11 |
| ABW | 2 | 2.92 | 70 | 0.08 | 80 |
| AEN | 2 | 2.91 | 70 | 0.08 | 72.25 |
| AHT | 2 | 4.01 | 40 | 0.1 | 46.34 |
| APC | 2 | 3.61 | 70 | 0.1 | 80 |
| BIK | 2 | 2.99 | 70 | 0.08 | 80 |
| MON | 2 | 3.24 | 70 | 0.1 | 80 |
| JBW | 2 | 3.35 | 70.27 | 0.08 | 80 |
| Feed is 0% CO2, 80% CH4 | | | | | |
| AHT | 2 | 5 | 40 | 0.1 | 56.33 |
| WEI | 2 | 3 | 40 | 0.09 | 55.74 |
| AEN | 2 | 3.62 | 70 | 0.09 | 79.08 |
| APC | 2 | 2.26 | 48.59 | 0.06 | 64.19 |
| BIK | 2 | 2.56 | 63.54 | 0.06 | 80 |
| JBW | 2 | 2.69 | 50.15 | 0.09 | 60.31 |
| MON | 2 | 2.27 | 70 | 0.07 | 80 |
| ABW | 2 | 1.99 | 40 | 0.05 | 42.86 |
| Feed is 0% CO2, 70% CH4 | | | | | |
| WEI | 2 | 3.6 | 40 | 0.1 | 51.65 |
| AEN | 2 | 3 | 64.55 | 0.07 | 80 |
| APC | 2 | 1.97 | 41.13 | 0.06 | 60.04 |
| AHT | 1 | 3.61 | 47.9 | 0.1 | 127.78 |
| JBW | 2 | 2.6 | 44.75 | 0.08 | 60.94 |
| MON | 2 | 1.89 | 70 | 0.05 | 80 |
| BIK | 1 | 3 | 40 | 0.05 | 120.48 |
| ABW | 2 | 1.65 | 40 | 0.02 | 54.72 |
| Feed is 0% CO2, 60% CH4 | | | | | |
| WEI | 2 | 3 | 45.89 | 0.06 | 62.65 |
| AHT | 2 | 2.06 | 40 | 0.05 | 55.9 |
| AEN | 2 | 3 | 40 | 0.08 | 49.56 |
| MON | 1 | 3.08 | 40 | 0.07 | 150 |
| APC | 1 | 2.29 | 40 | 0.05 | 143.12 |
| BIK | 1 | 2.18 | 40 | 0.05 | 145.08 |
| JBW | 2 | 2.98 | 40.55 | 0.07 | 43.62 |
| ABW | 1 | 1.35 | 42.55 | 0.02 | 135.65 |
| Feed is 50% CO2, 50% CH4 | | | | | |
| WEI | 2 | 4.5 | 40 | 0.1 | 57.41 |
| AEN | 1 | 2.9 | 40 | 0.07 | 135.08 |
| MON | 1 | 2.14 | 40 | 0.04 | 150 |
| JBW | 1 | 2.65 | 40 | 0.07 | 150 |
| AHT | 1 | 3 | 40 | 0.02 | 137.03 |
| BIK | 1 | 1.48 | 42.85 | 0.03 | 129.87 |
| APC | 1 | 1.69 | 40 | 0.04 | 80 |
| ABW | 1 | 1.25 | 41.14 | 0.01 | 150 |

What is claimed is:

1. A process for separating carbon dioxide from a mixture of molecules comprising:
   treating the mixture of molecules with a sorbent at a pressure of between about 0.5 to 15 bars, wherein the sorbent is a zeolite having one of the following framework types: ABW, AEN, AHT, APC, AWO, BIK, ERI, IHW, ITW, JBW, LTF, LTJ, MON, MVY, NAB, NSI, OFF, TON, VNI, and WEI, the zeolite comprising tetrahedrally-coordinated atoms of silicon and aluminum connected with oxygen atoms;
   adsorbing carbon dioxide gas from the mixture of molecules;
   reducing the pressure of the environment surrounding the carbon dioxide enriched sorbent.

2. The process of claim 1, where the adsorbing takes place at a pressure of between about 1-10 bars.

3. The process of claim 1, wherein the mixture comprises two or more gases chosen from carbon dioxide, nitrogen, water, oxygen, or hydrocarbon gases.

4. The process of claim 1, comprising reducing the pressure of the environment surrounding the carbon dioxide enriched sorbent to between 0.005-0.5 bars.

5. The process of claim 4, comprising reducing the pressure of the environment surrounding the carbon dioxide enriched sorbent to between 0.01-0.1 bars.

6. The process of claim 1 comprising dehydrating the mixture.

7. The process of claim 1, wherein the material is chosen from AHT, NAB, MVY, ABW, AWO, WEI, VNI, TON, OFF, ITW, LTF, ERI, and IHW.

8. The process of claim 1, wherein the material is chosen from WEI, AHT, AEN, ABW, APC, BIK, JBW, LTJ, MON, and NSI.

9. The process of claim 1, having a cycle time of between 40-500 seconds.

10. The process of claim 1, having a cycle time of between 100-250 seconds.

11. The process of claim 1, comprising compressing carbon dioxide gas at a pressure of between 1-250 bar.

12. The process of claim 1, wherein the mixture comprises two or more gases selected from the group consisting of carbon dioxide, nitrogen, water, and oxygen gases.

13. The process of claim 1, wherein the mixture comprises two or more gases selected from the group consisting of carbon dioxide, nitrogen, and oxygen gases.

14. The process of claim 1, wherein the mixture comprises is a flue gas.

* * * * *